United States Patent [19]

Hirohashi et al.

[11] Patent Number: 4,577,161

[45] Date of Patent: Mar. 18, 1986

[54] NOISE REDUCTION BY LINEAR INTERPOLATION USING A DUAL FUNCTION AMPLIFIER CIRCUIT

[75] Inventors: Kazutoshi Hirohashi, Yokohama; Yukinobu Ishigaki, Tokyo; Yasuomi Namiki, Yokohama, all of Japan

[73] Assignee: Victor Company of Japan, Ltd., Japan

[21] Appl. No.: 638,779

[22] Filed: Aug. 8, 1984

[30] Foreign Application Priority Data

Aug. 8, 1983 [JP] Japan .................. 58-144651

[51] Int. Cl.[4] .............................................. H03F 1/26
[52] U.S. Cl. ..................................... 330/149; 330/51; 328/165
[58] Field of Search ................. 307/352, 353; 328/151, 328/162, 165; 330/9, 51, 149; 381/94; 455/223, 224

[56] References Cited

FOREIGN PATENT DOCUMENTS 0103385 3/1984 European Pat. Off. .
2262560 6/1974 Fed. Rep. of Germany .

*Primary Examiner*—Eugene R. LaRoche
*Assistant Examiner*—Steven J. Mottola
*Attorney, Agent, or Firm*—Lowe, King, Price & Becker

[57] ABSTRACT

In a noise reduction circuit, a sampling pulse is generated for opening a switch in time-coincident relationship with a signal portion which is affected by a noise impulse. During tracking modes the signal is passed through the switch to a junction between a capacitor and a noninverting amplifier to charge the capacitor to the level of the signal. During a sampling mode the switch is open to block the signal. A feedback circuit having plural time constant values is connected between the output and input of the amplifier to provide primary and secondary differentiation of the output signal of the amplifier. The feedback circuit is disabled during tracking modes to enable the amplifier to linearly amplify the voltage developed across the capacitor and is enabled during the sampling mode to differentiate the voltage that occurred immediately before the switch is turned off for application to the input of the amplifier for linearly interpolating the noise-affected portion of the signal.

19 Claims, 5 Drawing Figures

NOISE REDUCTION BY LINEAR INTERPOLATION USING A DUAL FUNCTION AMPLIFIER CIRCUIT

CROSS-REFERENCES TO COPENDING APPLICATIONS

The present invention is related to the following copending U.S. patent applications:
(1) Ser. No. 516,242, filed July 21, 1983, by Ishigaki et al, titled "circuit for Reconstructing Noise-Affected Signals;"
(2) Ser. No. 517,985, filed July 29, 1983, by Y. Ishigaki, titled "Circuit Arrangement for Reconstructing Noise-Affected Signals;"
(3) Ser. No. 585,925, filed Mar. 2, 1983, by Y, Ishigaki et al, titled "Impulse noise reduction by linear inerpolation having a deemphasis characteristic;"
(4) Ser. No. 585,926, filed Mar. 2, 1984, by Y. Ishigaki et al, titled "Noise reduction by linear interpolation having immunity to white noise"; and
5. Ser. No. 632,875, filed July 20, 1984, by Namiki, entitled "Noise Reduction by Linear Interpolation Using a Single-Sample-Hold Circuit."

All of the copending applications are assigned to the same assignee as the present invention.

BACKGROUND OF THE INVENTION

The present invention relates to a noise reduction circuit of the type wherein the noise-affected portion of an information signal is linearly interpolated.

Linear interpolation techniques are known in the art as a means for reconstructing an audio signal portion which is disrupted by a noise impulse. As shown and described in the above listed copending U.S. applications, the linear interpolation approach involves the use of two sample-and-hold circuits. The first sample-and-hold circuit is connected in a circuit between input and output terminals for generating a voltage which follows the waveform of the input signal during tracking modes and samples a voltage that occurs immediately prior to the detection of a noise impulse. During a sampling mode in which the information signal is affected by a noise impulse, the second sample-and-hold circuit generates a voltage that represents the rate with which previous gradient is expected to continue during this period and compensates for the voltage stored on the first sample-and-hold circuit.

SUMMARY OF THE INVENTION

An object of the present invention is to simplify the configuration of a noise reduction circuit by eliminating the second sample-and-hold circuit.

The noise reduction circuit of the present invention comprises a noise detector connected to an input terminal for detecting a noise impulse introduced in an information signal and generating a sampling pulse that is time-coincident with the portion of the signal affected by a noise impulse. A switch is provided for passing the information signal to a node between a capacitor and a noninverting amplifier in the absence of the sampling signal and blocking the signal in response to the sampling pulse. A feedback circuit having a plurality of time constant values is connected between the output and input of the amplifier to provide primary and secondary differentiation of the output signal of the amplifier. The feedback circuit is disabled during tracking modes to enable the amplifier to provide linear amplification of the voltage developed across the capacitor and is enabled during sampling modes to differentiate the voltage that occurred immediately before the switch is turned off, the differentiated signal being applied to the input of the amplifier for linearly interporating the noise-affected portion of the signal.

BRIEF DESCRIPTION OF THE DRAWINGS

The present invention will be described in further detail with reference to the accompanying drawings, in which.

DETAILED DESCRIPTION

Figure 1:
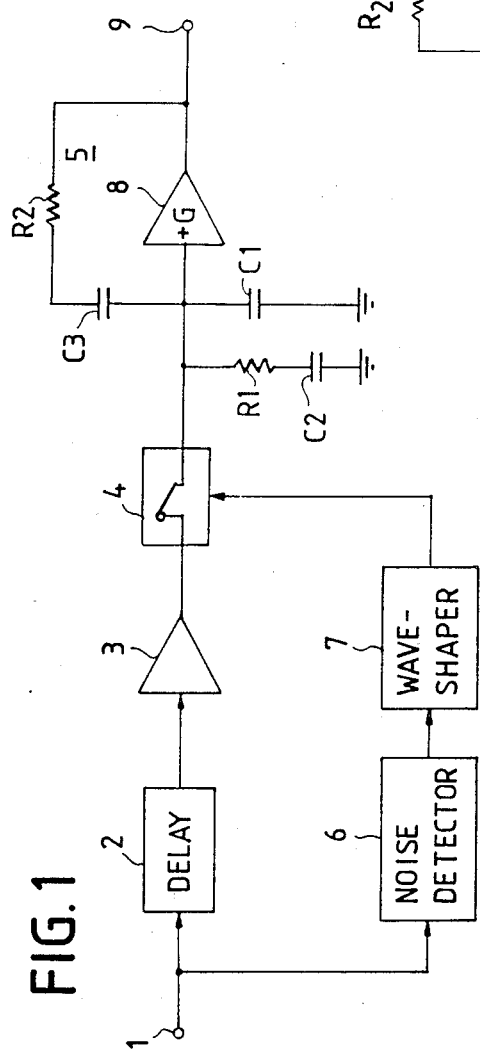
FIG. 1 is a block diagram of a first embodiment of the present invention.

Referring now to FIG. 1, there is shown a first embodiment of the present invention. The noise reduction circuit shown therein comprises a series combination of a noise detector 6 and a waveshaper 7. The noise detector produces a pulse output in response to the detection of a noise impulse introduced to an audio signal applied to an input terminal 1. The pulse output is shaped into a shaprly defined rectangular pulse and applied as a sampling pulse to a normally closed electronic switch 4 which forms part of a sample-and-hold circuit. The audio input signal is delayed by a delay circuit 2 so that the portion of the audio signal which is affected by the noise impulse is rendered time coincident with the sampling pulse.

The delayed audio signal is passed through an amplifier 3 and switch 4 to a dual function amplifier circuit 5. This amplifier circuit comprises a noninverting amplifier 8 and a feedback differentiator formed by a resistor R2 and a capacitor C3 which are series connected from the output of amplifier 8 to the input thereof to which the output of amplifier 3 is also applied through switch 4.

Amplifier 3 and switch 4 form a sample-and-hold circuit with a capacitor C1 which is grounded at one end and connected at the other end to the capacitor C1. A series combination of a resistor R1 and a capacitor C2 is connected in parallel with capacitor C1.

Dual function amplifier circuit 5 operates as a linear amplifier when switch 4 remains closed to deliver an amplified audio signal to an output terminal 9 and as a slope detector when this switch is open to generate a linearly varying voltage for interpolating the noise-affected portion of the input signal. This noninverting amplifier 8 has an input impedance much higher than the output impedance of amplifier 3.

In the absence of a noise impulse, switch 4 remains in a closed circuit condition, coupling the input signal to the capacitor C1. Since the output impedance of amplifier 3 is much lower than the input impedance of amplifier 8, the feedback differentiator ceases to function, i.e., is disabled, during the closed circuit condition with the result that capacitor C1 is charged to the voltage level of the input signal. Therefore, the potential at terminal 9 follows the voltage on capacitor C2 as long as the audio signal is not affected by noise impulses and the noise reduction circuit operates in a tracking mode.

Figure 2:
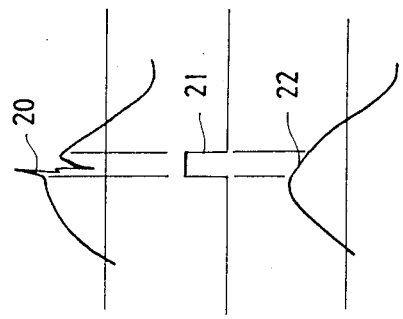
FIG. 2 is an illustration of waveforms generated in the circuit of FIG. 1.

In response to the detection of a noise impulse, shown at 20 in FIG. 2, a sampling pulse 21 is generated and switch 4 changes over to an open circuit condition. The voltage, which appeared at the moment immediately prior to the detection of the noise, is sampled and stored in capacitor C1 and amplified with a gain G. The feedback circuit is now enabled to begin differentiating the output of amplifier 8 and the noise-affected portion of the audio signal is interpolated with a linearly varying voltage as shown at 22 in FIG. 2. During the turn-off state of switch 4, the dual function amplifier circuit 5 is represented by an equivalent circuit shown in FIG. 3. If impulse noise occurs on a positive or uphill slope of the information signal, the interpolating voltage increases linearly, and if it occurs on a negative or downhill slope the voltage will decrease linearly.

Figure 3:
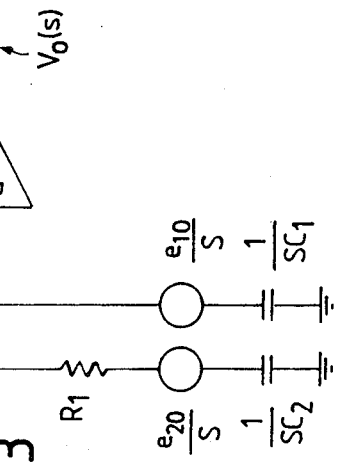
FIG. 3 is an illustration of an equivalent circuit of the first embodiment.

A mathematical analysis of the noise reduction circuit of FIG. 1 is given with reference to the equivalent circuit of FIG. 3. The voltage output Vo(s) which appears at terminal 9 at the instant the open circuit condition occurs is given in Laplace transform notation by Equation 1:

$$Vo(s) = G \frac{C_1(1 + T_1S)(1 + T_2S)e_{10} - C_3(1 + T_2S)e_{30} + C_2(1 + T_1 \cdot S)e_{20}}{S[(1 - G)C_3 + C_2 + C_1 + \{C_2 \cdot T_1 + C_3(1 - G)T_2 + C_1 \cdot T_1 + C_1 \cdot T_2\}S + C_1 \cdot T_1 \cdot T_2 \cdot S^2]} \quad (1)$$

where $C_1$ = capacitance of capacitor C1,
$C_2$ = capacitance of capacitor C2,
$C_3$ = capacitance of capacitor C3,
$R_1$ = resistance of resistor R1,
$R_2$ = resistance of resistor R2,
$R_3$ = resistance of resistor R3,
$T_1$ = time constant $R_2 \times C_3$,
$T_2$ = time constant $R_1 \times C_2$, and $e_{10}$, $e_{20}$ and $e_{30}$ are voltages developed at the moment immediately prior to the detection of a noise impulse in capacitors C1, C2 and C3, respectively.

If the following relations exist:

$$C_1 + C_2 = (G-1)C_3 \quad (2)$$

$$C_2 \cdot T_2 = (G-1)C_3 \cdot T_1 \quad (3)$$

then Equation 1 can be rewritten as follows:

$$Vo(s) = G \frac{C_1(1 + T_1 \cdot S)(1 + T_2 \cdot S)e_{10} - C_3(1 + T_2 \cdot S)e_{30} + C_2(1 + T_1 \cdot S)e_{20}}{C_1 \cdot T_1 \cdot T_2 \cdot S^3} \quad (4)$$

Assuming that the initial voltage level at the input terminal 1 just prior to the turn-off of switch 4 is $A \sin \omega t$, the voltages $e_{10}$, $e_{20}$ and $e_{30}$ are respectively given by:

$$e_{10} = A \sin \omega t_1 \quad (5)$$

$$e_{20} = A \{\sin \omega t_1 - n \cdot T_2 \cdot \omega \sin (\omega t_1 + \beta)\} \quad (6)$$

$$e_{30} = A(G-1) \{\sin \omega t_1 - m \cdot T_1 \cdot \omega \sin (\omega t_1 + \alpha)\} \quad (7)$$

where, $$m = \frac{1}{\sqrt{1 + (\omega T_1)^2}}$$

$$n = \frac{1}{\sqrt{1 + (\omega T_2)^2}}$$

$$\alpha = \tan^{-1} \frac{1}{\omega T_1}$$

$$\beta = \tan^{-1} \frac{1}{\omega T_2}$$

By substituting Equations 5, 6 and 7 into Equation 4 and providing an inverse Lapalace transformation, the following Equation is obtained:

$$Vo(t) = G \cdot a \left[ \sin \omega t_1 + \frac{\omega(t - t_1)\{a \cdot m \sin(\omega t_1 + \alpha) - n \cdot \sin(\omega t_1 + \beta)\}}{a - 1} + \frac{\omega(t - t_1)^2\{m \cdot \sin(\omega t + \alpha) - n \cdot \sin(\omega t_1 + \beta)\}}{2(a - 1)T_1} \right] \quad (8)$$

where, $a = (G-1)C_3/C_2$. For $\omega$ being much lower than $2\pi/T_1$ and $2\pi/T_2$, Equation 8 can be rewritten as follows:

$$Vo(t) = G \cdot A \left[ \sin \omega t_1 + (t - t_1)\omega \cdot \sin(\omega t_1 + 90) + \frac{(t - t_1)}{2!} \omega^2 \sin(\omega t_1 + 180) \right] \quad (9)$$

Since Equation 9 corresponds to a Tailor's series whose value at time $t_1$ and thereafter is given by $$f(t) = f(t_1) + f'(t_1)(t - t_1) + f'' \frac{(t - t_1)^2}{2!} \quad (10)$$

the output voltage at terminal 9 varies at a rate which is proportional to the first and second order differentiations of the voltage sampled at the instant immediately prior to the turn-off of switch 4. It is seen that for a noise impulse that exists for a sufficiently small duration in relation to the information signal the noise reduction circuit provides linear interpolation as shown at 22 in FIG. 2 during the noise-affected portion in which the previous gradient is expected to continue.

Figure 4:
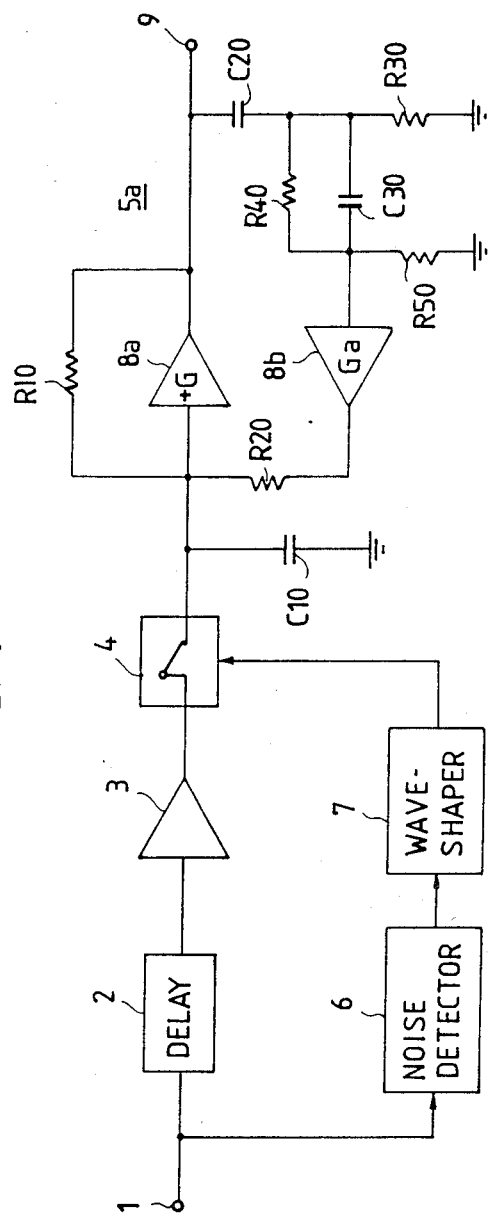
FIG. 4 is a block diagram of a second embodiment of the present invention.

A second embodiment of the present invention is illustrated in FIG. 4. The second embodiment includes a dual function amplifier 5a comprising a noninverting amplifier 8a having a gain G, a feedback resistor R10 coupled fom the output to the input of amplifier 8a. Connected between the output of amplifier 8a and ground is a series time constant circuit including a capacitor C20 and a resistor R30 with a time constant value $T_{10}(=C_{20} \cdot R_{30})$. The junction between capacitor C20 and resistor R30 is connected to the input of a second noninverting amplifier 8b by a parallel time constant circuit formed by a capacitor C30 and a resistor R40 with a time constant value $T_{20}(=C_{30} \cdot R_{40})$. The output of amplifier 8b is connected by a resistor R20 to the input of amplifier 8a to which is also connected one end of a capacitor C10 which is grounded at the other end. The junction between capacitor C30 and the input of amplifier 8b is coupled to ground by a resistor R50.

Figure 5:
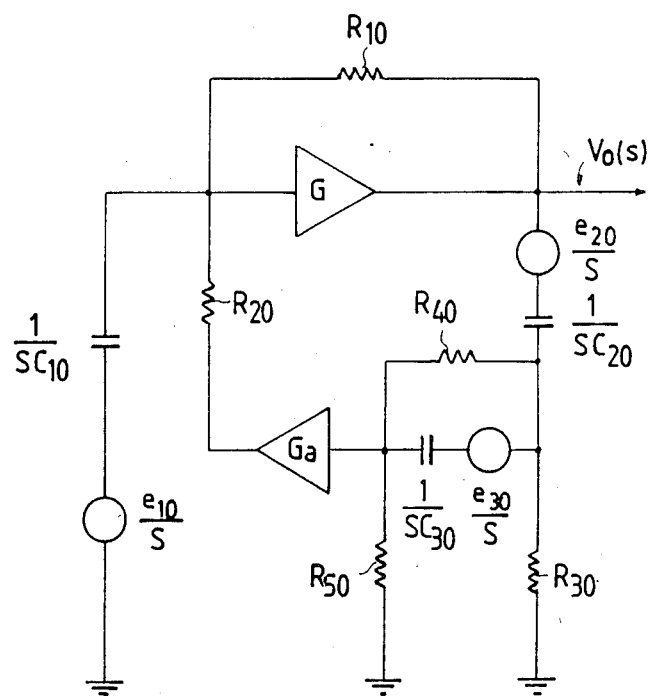
FIG. 5 is an illustration of an equivalent circuit of the second embodiment.

With switch 4 being in a closed state, the amplifier 8a acts as a linear amplifier due to the low output impedance of amplifier 3 as in the first embodiment, providing amplification of the audio signal. With switch 4 turned off, the dual function amplifier circuit 5a is represented by an equivalent circuit shown in FIG. 5.

A Laplace transform notation of the output voltage Vo(s) is given by the following Equation:

$$Vo(s) = G \frac{(R_{20} + R_{10})T_{10}(1 + T_1 \cdot S)(1 + T_{30} \cdot S) \times}{R_{20} + R_{10} - G \cdot R_{20} + \{(R_{20} + R_{10})(T_{10} + T_{30} + T_{40}) - G \cdot R_{20}(T_{10} + T_{30}) - \}S}$$

$$\frac{e_{10} - Ga \cdot n \cdot R_{10}\{T_{10}(1 + T_{20} \cdot S) \times}{Ga \cdot n \cdot G \cdot R_{10} \cdot T_{10}\}S + \{(R_{20} + R_{10})(T_{10} \cdot T_{30} + T_{10} \cdot T_{40} + T_{30} \cdot T_{40}) -}$$

$$\frac{e_{20} + T_{20}(1 + T_{10} \cdot S)e_{30}\}}{G \cdot R_{20} \cdot T_{10} \cdot T_{30} - Ga \cdot n \cdot G \cdot R_{10} \cdot T_{10} \cdot T_{20}\}S^2 + (R_{20} + R_{10})T_{10} \cdot T_{30} \cdot T_{40} \cdot S^3} \quad (11)$$

where,
Ga = the gain of amplifier 8b,
$T_{30}$ = a time constant value $C_{30}(R_{40}//R_{50})$,
$T_{40}$ = a time constant value $C_{10}(R_{20}//R_{10})$,
n = a constant $R_{50}/(R_{40}+R_{50})$, and
$e_{10}$, $e_{20}$ and $e_{30}$ are voltages developed at the moment immediately prior to the detection of a noise impulse in capacitors C10, C20 and C30, respectively.

By establishing the following relations, $$R_{10} = (G-1)R_{20} \quad (12)$$

$$T_{40} = Ga \cdot n \cdot G \cdot T_{10} \quad (13)$$

$$T_{20} = T_{10} + T_{30} \quad (14)$$

the zero, first and second orders of the denominator S of Equation 11 can be set to equal zero and the voltage Vo(s) can be represented by Equation 15 as follows:

$$Vo(s) = G \left\{ \frac{e_{10}}{S} + \frac{G \cdot T_{10}(1 + T_{20} \cdot S)e_{10} - T_{10}(1 + T_{20} \cdot S)e_{20} - T_{20}(1 + T_{10} \cdot S)e_{30}}{G \cdot T_{10}^2 \times T_{30} \cdot S^3} \right\} \quad (15)$$

Assuming that the input signal at the moment immediately prior to the turn-off of switch 4 is A sin ωt, as in the previous embodiment, the voltages $e_{10}$, $e_{20}$ and $e_{30}$ developed across capacitors C10, C20 and C30 at the same moment for angular frequencies ω much lower than $2\pi/T_{10}$ and $2\pi/T_{20}$ are given by the following Equations:

$$e_{10} = A \sin \omega t_1 \quad (16)$$

$$e_{20} = G \cdot A \{\sin \omega t_1 - T_{10} \cdot \omega \cdot \sin (\omega t_1 + 90)\} \quad (17)$$

$$e_{30} = G \cdot A \cdot n \cdot T_{10}\{\omega \cdot \sin (\omega t_1 + 90) - (T_{20} - T_{30})\omega^2 \cdot \sin (\omega t_1 + 180)\} \quad (18)$$

By substituting Equations 16, 17 and 18 for $e_{10}$, $e_{20}$ and $e_{30}$ of Equation 15 and providing an inverse Laplace transformation, the following Equation is obtained:

$$Vo(t) = G \cdot A \left\{ \sin \omega t_1 + (t - t_1)\omega \cdot \sin(\omega t_1 + 90) + \frac{(t - t_1)^2 \cdot \omega^2 \cdot \sin(\omega t_1 + 180)}{2!} \right\} \quad (19)$$

where, $T_{10} = n \cdot T_{20}$ and $n = \frac{1}{2}$ and $T_{10}$ is much smaller than unity.

From Equation 19 it is seen that the dual function amplifier circuit 5a has the first and second order differentiating capabilities as in the previous embodiment.

What is claimed is:

1. A noise reduction circuit having an input terminal to which an information signal is applied and an output terminal, comprising:

means connected to said input terminal for detecting a noise impulse introduced in said information signal and generating therefrom a sampling pulse that is time-coincident with the portion of the signal affected by said noise impulse;

a switch connected in a circuit path between said input and output terminals for passing said information signal therethrough in the absence of said sampling pulse and blocking said signal in response to said sampling pulse;

a first amplifier connected in said circuit path between said input terminal and said switch, said first amplifier having an input and output and an output impedance;

a second, noninverting amplifier connected in said circuit path between said switch and said output terminal, the second amplifier having an input impedance greater than the output impedance of said first amplifier, said second amplifier having an input and output;

a capacitor coupled from a node between said switch and the input of said second amplifier to ground; and feedback circuit means coupled from the output of said second amplifier to the input thereof, the feedback circuit means including time constant means forming a plurality of time constant values with said capacitor for providing primary and secondary differentiation on an output signal from said second amplifier and applying the differentiated signal to the input of said second amplifier.

2. A noise reduction circuit as claimed in claim 1, wherein said time constant means comprises a first time constant circuit coupled between the output and input of said noninverting amplifier and a second time constant circuit connected between the input of said noninverting amplifier and ground.

3. A noise reduction circuit as claimed in claim 2, wherein each of said first and second time constant circuits includes a capacitance and a resistance and said circuits satisfy relationships (a) and (b):

$$C_1 + C_2 = C_3(G-1) \quad (a)$$

$$T_2 \times C_2 = T_1 \cdot C_3(G-1) \quad (b)$$

where,
$C_1$ = the capacitance of said capacitor,
$C_2$ = the capacitance of said second time constant circuit,
$C_3$ = the capacitance of said first time constant circuit,
$R_1$ = the resistance of said second time constant circuit,
$R_2$ = the resistance of said first time constant circuit,
$T_1 = R_2 \cdot C_3$, and
$T_2 R_1 \cdot C_2$.

4. A noise reduction circuit as claimed in claim 1, wherein said time constant means comprises:
a third amplifier;
a first resistor coupled between the output and input of said second amplifier;
a second resistor coupled between the input of said second amplifier and the output of said third amplifier;
a second capacitor and a third resistor connected in series with each other between the output of said second amplifier and ground;
a third capacitor and a fourth resistor connected in parallel with each other from a junction between said second capacitor and said third resistor to the input of said third amplifier; and
a fifth resistor connected between the input of said third amplifier and ground.

5. A noise reduction circuit as claimed in claim 4, wherein said time constant means satisfies the following relationships:

$$R_4 = R_5,$$

$$2 \cdot C_2 \cdot R_3 = C_3 \cdot R_4,$$

$$C_1 \cdot R_2 = G \cdot Ga \cdot C_2 \cdot R_3/2,$$

and $$R_1 = R_2(G-1),$$

where,
$R_1$ = the resistance of said first resistor;
$R_2$ = the resistance of said second resistor;
$R_3$ = the resistance of said third resistor;
$R_4$ = the resistance of said fourth resistor;
$R_5$ = the resistance of said fifth resistor;
$C_1$ = the capacitance of the first-mentioned capacitor;
$C_2$ = the capacitance of said second capacitor;
$C_3$ = the capacitance of said third capacitor;
G = the amplification gain of said noninverting amplifier; and
Ga = the amplification gain of said second amplifier.

6. A noise reduction circuit having an input terminal to which an information signal is applied and an output terminal, comprising:
means connected to said input terminal for detecting a noise impulse introduced in said information signal and generating therefrom a sampling pulse that is time-coincident with the portion of the signal affected by said noise impulse;
a switch connected in a circuit path between said input and output terminals for passing said information signal therethrough in the absence of said sampling pulse and blocking said signal in response to said sampling pulse;
a noninverting amplifier connected in said circuit path between said switch and said output terminal, said amplifier having an input and output;
a capacitor coupled from a node between said switch and the input of said amplifier to ground; and
feedback circuit means coupled from the output of said amplifier to the input thereof, the feedback circuit means including:
a second amplifier having an input and output;
a first resistor coupled between the output and input of said noninverting amplifier;
a second resistor coupled between the input of said noninverting amplifier and the output of said second amplifier;
a second capacitor and a third resistor connected in series with each other between the output of said noninverting amplifier and ground;
a third capacitor and a fourth resistor connected in parallel with each other from a junction between said second capacitor and said third resistor to the input of said second amplifier; and
a fifth resistor connected between the input of said second amplifier and ground.

7. A noise reduction circuit as claimed in claim 6, wherein said time constant means satisfies the following relationships:

$$R_4 = R_5,$$

$$2 \cdot C_2 \cdot R_3 = C_3 \cdot R_4,$$

$$C_1 \cdot R_2 = G \cdot Ga \cdot C_2 \cdot R_3/2,$$

and $$R_1 = R_2(G-1),$$

where,
$R_1$ = the resistance of said first resistor;
$R_2$ = the resistance of said second resistor;
$R_3$ = the resistance of said third resistor;
$R_4$ = the resistance of said fourth resistor;
$R_5$ = the resistance of said fifth resistor;
$C_1$ = the capacitance of the first-mentioned capacitor;
$C_2$ = the capacitance of said second capacitor;
$C_3$ = the capacitance of said third capacitor;
G = the amplification gain of said noninverting amplifier; and
Ga = the amplification gain of said second amplifier.

8. A noise reduction circuit having an input terminal to which an information signal is applied and an output terminal, comprising:
means connected to said input terminal for detecting a noise impulse introduced in said information signal and generating therefrom a sampling pulse that is time-coincident with the portion of the signal affected by said noise impulse;

a switch connected in a circuit path between said input and output terminals for passing said information signal therethrough in the absence of said sampling pulse and blocking said signal in response to said sampling pulse;

a first amplifier connected in said circuit path between said input terminal and said switch, said first amplifier having an input and output and an output impedance;

a second, noninverting amplifier connected in said circuit path between said switch and said output terminal, the second amplifier having an input impedance greater than the output impedance of said first amplifier, said second amplifier having an input and output;

a capacitor coupled from a node between said switch and the input of said second amplifier to ground; and circuit means having first and second time constants connected to the input and output of said second amplifier, the output impedance of the first amplifier, the input impedance of the second amplifier and the circuit means having impedances such that: (a) while the switch is closed the second amplifier functions as a linear amplifier to derive a replica of the voltage at the output of the first amplifier, and (b) while the switch is open (i) the voltage across the capacitor is approximately equal to the voltage at the output of the first amplifier immediately prior to opening of the switch, and (ii) the output of the second amplifier is a varying voltage including components representing first and second derivatives of the voltage across the capacitor.

9. The circuit of claim 8 wherein the circuit means includes: a first circuit including a resistor and capacitor connected in shunt between the input of the second amplifier and ground, and a second circuit including another resistor and another capacitor connected in a feedback path shunting the output and input of the second amplifier.

10. The circuit of claim 9 wherein the resistor and capacitor of the first circuit are in series with each other.

11. The circuit of claim 9 wherein the resistor and capacitor of the second circuit are in series with each other.

12. The circuit of claim 11 wherein the resistor and capacitor of the first circuit are in series with each other.

13. The circuit of claim 12 wherein the resistances $R_1$ and $R_2$ of the first and second circuits and the capacitances $C_1$ and $C_2$ of the first and second circuits are related to each other as:

$$C_1 + C_2 = C_3(G-1) \quad \text{(a)}$$

$$T_2 \times C_2 = T_1 \cdot C_3(G-1) \quad \text{(b)}$$

where,
$C_1$ = the capacitance of said capacitor,
$C_2$ = the capacitance of said second time constant circuit,
$C_3$ = the capacitance of said first time constant circuit,
$R_1$ = the resistance of said second time constant circuit,
$R_2$ = the resistance of said first time constant circuit,
$T_1 = R_2 \cdot C_3$, and
$T_2 = R_1 \cdot C_2$.

14. The circuit of claim 8 wherein the circuit means includes a first circuit including a resistor and capacitor connected in shunt between the output of the second amplifier and ground, a tap between the resistor and capacitor, and a feedback path connected between the tap and the input of the second amplifier, said path including an additional resistor and an additional capacitor.

15. The circuit of claim 14 wherein the capacitor of the first circuit is connected between the output of the second amplifier and the tap, the additional resistor and additional capacitor being connected in parallel with each other.

16. The circuit of claim 15 further including a third amplifier in said feedback path having an input responsive to current flowing through said additional resitor and additional capacitor.

17. The circuit of claim 16 further including another resistor in shunt with the input of said third amplifier.

18. The circuit of claim 17 further including yet another resistor in shunt with the second amplifier and yet a further resistor in the feedback path at an output of the third amplifier.

19. The circuit of claim 18 wherein the resistors and capacitors are related to each other in accordance with:

$$R_4 = R_5,$$

$$2 \cdot C_2 \cdot R_3 = C_3 \cdot R_4,$$

$$C_1 \cdot R_2 = G \cdot Ga \cdot C_2 \cdot R_3/2,$$

and $$R_1 = R_2(G-1),$$

where,
$R_1$ = the resistance of said yet another resistor;
$R_2$ = the resistance of said yet further resistor;
$R_3$ = the resistance of said resistor of the first circuit;
$R_4$ = the resistance of said additional resistor;
$R_5$ = the resistance of said fifth resistor;
$C_1$ = the capacitance of the first-mentioned capacitor;
$C_2$ = the capacitance of said capacitor of the first circuit;
$C_3$ = the capacitance of said additional capacitor;
$G$ = the amplification gain of said noninverting amplifier; and
$Ga$ = the amplification gain of said second amplifier.

* * * * *